US012689347B2

(12) United States Patent
Shih et al.

(10) Patent No.: US 12,689,347 B2
(45) Date of Patent: Jul. 21, 2026

(54) ELECTRONIC DEVICE

(71) Applicant: VIA LABS, INC., New Taipei City (TW)

(72) Inventors: Did-Min Shih, New Taipei City (TW); Chia-Wei Chang, New Taipei City (TW); Yen-Wei Wu, New Taipei City (TW)

(73) Assignee: VIA LABS, INC., New Taipei City (TW)

( * ) Notice: Subject to any disclaimer, the term of this patent is extended or adjusted under 35 U.S.C. 154(b) by 250 days.

(21) Appl. No.: 18/401,900

(22) Filed: Jan. 2, 2024

(65) Prior Publication Data

US 2025/0055437 A1 Feb. 13, 2025

Related U.S. Application Data

(60) Provisional application No. 63/518,088, filed on Aug. 7, 2023.

(30) Foreign Application Priority Data

Oct. 13, 2023 (TW) ................................. 112139136

(51) Int. Cl.
*H03H 7/01* (2006.01)
*H03H 7/06* (2006.01)
*H03H 7/38* (2006.01)

(52) U.S. Cl.
CPC ............ *H03H 7/1741* (2013.01); *H03H 7/06* (2013.01); *H03H 7/38* (2013.01)

(58) Field of Classification Search
CPC ........... H03H 7/1741; H03H 7/06; H03H 7/38

(Continued)

(56) References Cited

U.S. PATENT DOCUMENTS

| | | | |
|---|---|---|---|
| 11,374,603 B2 | 6/2022 | Liu | |
| 2011/0187481 A1* | 8/2011 | Alkan | H03H 7/06 |
| | | | 333/175 |
| 2019/0044564 A1 | 2/2019 | Zhang | |

FOREIGN PATENT DOCUMENTS

TW 202139611 A 10/2021

OTHER PUBLICATIONS

Chinese language office action dated Jul. 10, 2024, issued in application No. TW 112139136.

(Continued)

*Primary Examiner* — Andrea Lindgren Baltzell
*Assistant Examiner* — Abigail Amir Yaldo
(74) *Attorney, Agent, or Firm* — McClure, Qualey & Rodack, LLP

(57) ABSTRACT

An electronic device includes a shared pin and a bandwidth extension circuit. The electronic device receives or transmits a signal through the shared pin. The bandwidth extension circuit is electrically coupled to the shared pin. The bandwidth extension circuit includes a first inductor, a second inductor, a first capacitor, a second capacitor, and a third capacitor. The first inductor is electrically connected between the shared pin and a node. The second inductor is electrically connected to the first inductor through the node. The first capacitor is electrically connected between the node and a ground. The second capacitor is electrically connected between the shared pin and the ground. The third capacitor is electrically connected between the second inductor and the ground. The first inductor is different from the second inductor. There is no coupling effect between the first inductor and the second inductor.

11 Claims, 2 Drawing Sheets

(58) Field of Classification Search
USPC ......................................................... 333/175
See application file for complete search history.

(56) References Cited

OTHER PUBLICATIONS

Jeong, D.K.; "Topics in IC Desig T-Coil;" School of Electrical and Computer Engineering Seoul National University; Chapter of Asymmetric T-Coil; Nov. 2020; pp. 1-27 https://ocw.snu.ac.kr/sites/default/files/NOTE/Lec%2010%20-%20Bandwidth%20Extension%20Techniques.pdf.

* cited by examiner

200

ELECTRONIC DEVICE

CROSS REFERENCE TO RELATED APPLICATIONS

This application claims priority of Taiwan Patent Application No. 112139136 filed on Oct. 13, 2023, and priority of U.S. Provisional Application Ser. No. 63/518,088, filed on Aug. 7, 2023, the entirety of which are incorporated by reference herein.

BACKGROUND OF THE INVENTION

Field of the Invention

The disclosure generally relates to an electronic device, and more particularly, to an electronic device for improving the impedance matching bandwidth of a shared pin.

Description of the Related Art

In existing designs for integrated circuits (ICs), T-coil circuits are often used to increase the bandwidth of the circuit, and the nodes between the two inductors in the T-coil circuit are often electrically connected directly to the receiving circuit and the transmitting circuit. However, since the nodes in the two inductors in the T-coil circuit are connected to the receiving circuit and the transmitting circuit at the same time, there may be parasitic capacitance in the receiving circuit and the transmitting circuit, and this parasitic capacitance may all be superposed on the nodes. This causes the equivalent capacitance connected to the nodes to increase. As a result, the bandwidth becomes smaller, or the bandwidth increased is limited.

BRIEF SUMMARY OF THE INVENTION

An embodiment of the present invention provides an electronic device comprising a shared pin and a bandwidth extension circuit. The electronic device receives or transmits a signal through the shared pin. The bandwidth extension circuit is electrically coupled to the shared pin and comprises a first inductor, a second inductor, a first capacitor, a second capacitor and a third capacitor. The first inductor is electrically connected between the shared pin and a node. The second inductor is electrically connected to the first inductor through the node. The first capacitor is electrically connected between the node and a ground. The second capacitor is electrically connected between the shared pin and the ground. The third capacitor is electrically connected between the second inductor and the ground. The first inductor is different from the second inductor, and there is no coupling effect between the first inductor and the second inductor.

The electronic device mentioned above further comprises a high-frequency impedance matching circuit electrically connected between the shared pin and the bandwidth extension circuit. The high-frequency impedance matching circuit comprises a third inductor, a fourth capacitor, a fifth capacitor, a first resistor and a second resistor. The third inductor is electrically connected between the shared pin and the first inductor. The fourth capacitor is electrically connected to one terminal of the third inductor. The fifth capacitor is electrically connected to another terminal of the third inductor. The first resistor is electrically connected between the fourth capacitor and the ground. The second resistor is electrically connected between the fifth capacitor and the ground.

The electronic device mentioned above further comprises a switch and a terminal resistor. The switch is electrically connected to the second inductor. The terminal resistor is electrically connected between the switch and the ground. When the electronic device receives the signal through the shared pin, the switch is turned on. When the electronic device transmits the signal through the shared pin, the switch is turned off.

In the electronic device mentioned above, the signal is a differential signal.

The electronic device mentioned above further comprises a receiving circuit electrically connected to the node to receive the signal from the shared pin.

The electronic device mentioned above further comprises a transmitting circuit electrically connected to the second inductor to transmit the signal to the shared pin.

In the electronic device mentioned above, the first capacitor comprises parasitic capacitance generated when the receiving circuit is connected to the node.

In the electronic device mentioned above, the third capacitor comprises parasitic capacitance generated when the transmitting circuit is connected to the second inductor.

In the electronic device mentioned above, the first capacitor comprises parasitic capacitance generated when an electrostatic discharge diode (ESD) is connected to the node.

In the electronic device mentioned above, the shared pin is a pin of a semiconductor package. The semiconductor package comprises a semiconductor chip.

In the electronic device mentioned above, the node is a pin of the semiconductor chip. The first inductor and the second inductor are bonding wires for electrically connecting to the shared pin.

In the electronic device mentioned above, the signal comprises a high-frequency component signal and a low-frequency component signal. When the electronic device receives the signal through the shared pin, the high-frequency component signal terminates in the first resistor and the low-frequency component signal terminates in the terminal resistor.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
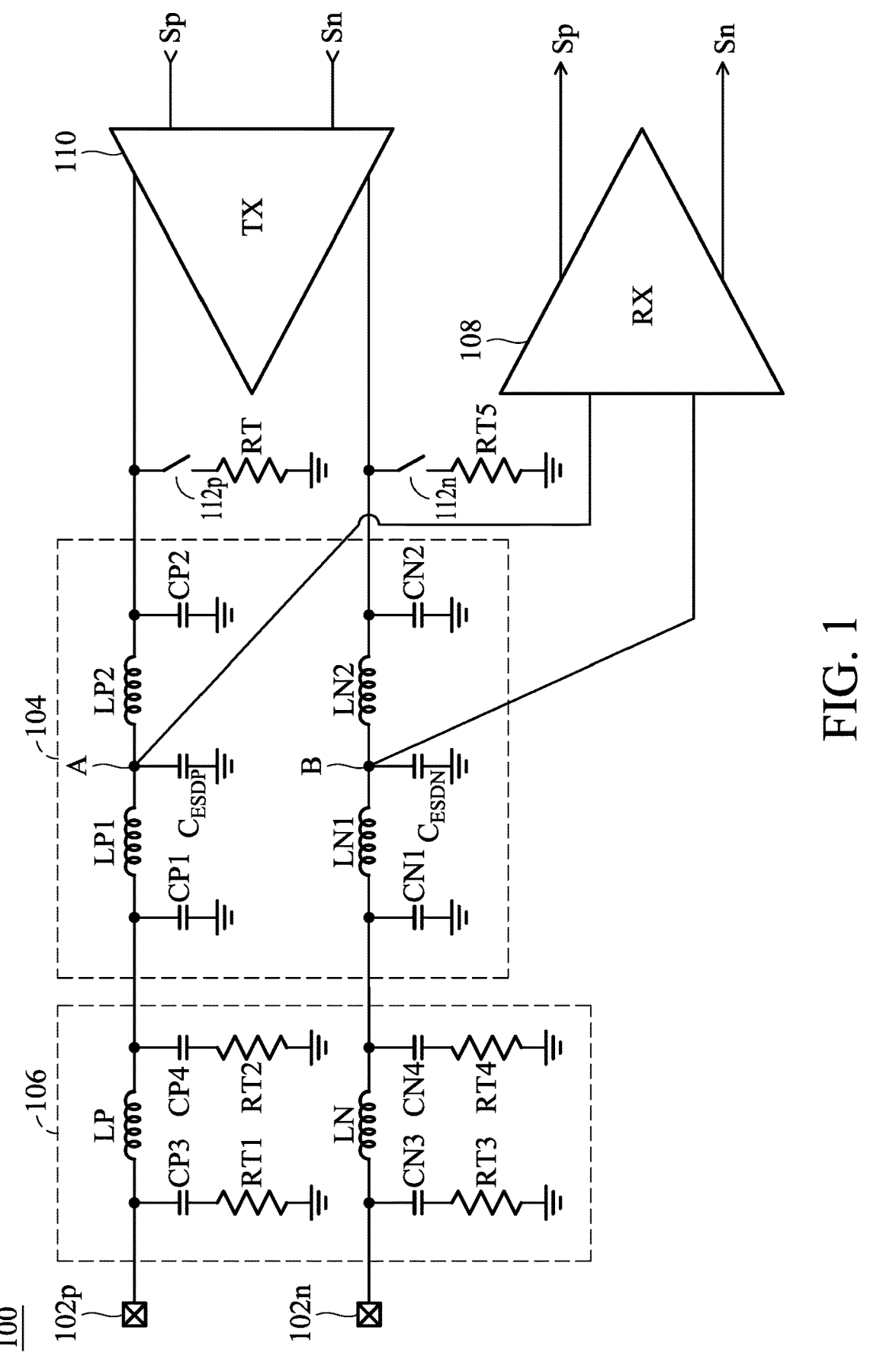
FIG. 1 is a schematic diagram of an electronic device 100 according to an embodiment of the invention.

The exemplary embodiments of the present invention are referred in the following descriptions, and the examples of the exemplary embodiments are illustrated in the appended figures. Whenever possible, the same reference numbers in the figures and descriptions represent the same or similar parts.

Throughout the description of the present invention and the appended claims, certain words are used to refer to specific components. One of ordinary skill in the art should understand that the manufacturers of electronic devices may refer to the same component by different names. This article is not intended to differentiate between components that have the same functionality but have different names. In the following descriptions and claims, the words "include" and "comprise" are open-ended words, so they should be interpreted to mean "including but not limited to . . . ".

The terms "approximately", "equal to", "equal" or "the same", or "substantially" are generally interpreted to mean within 20% of a given value or range, or to mean within 10%, 5%, 3%, 2%, 1% or 0.5% of a given value or range.

The ordinal numbers used in the specification and the claims, such as "first", "second", etc., are used to modify elements. They do not imply or represent that the element (or elements) have any previous ones. Ordinal numbers do not represent the order of one component with another component, or the order of manufacturing methods. The use of these ordinal numbers is only used to clearly distinguish a component with a certain name from another component with the same name. The same words may not be used in the claims and the description. Accordingly, the first component in the description may be the second component in the claims.

The electrical connection or coupling described in the present invention can refer to a direct connection or an indirect connection. In the case of direct connection, the end points of the components on the two circuits are directly connected or connected to each other with a conductor line segment. In the case of indirect connection, there are switches, diodes, capacitors, inductors, resistors, other suitable components, or combinations of the above components between the end points of the components in the two circuits, but are not limited to this.

It should be noted that the following embodiments can be replaced, reorganized, and mixed with features of several different embodiments without departing from the spirit of the present invention to complete other embodiments. Features in various embodiments may be mixed and matched as long as they do not violate the spirit of the invention or conflict with each other.

Unless otherwise defined, all terms (including technical and scientific terms) used herein have the same meanings as commonly understood by those skilled in the art to which this invention belongs. It is understood that these terms, such as those defined in commonly used dictionaries, should be interpreted to have a meaning consistent with the relevant technology and the background or context of the invention, and should not be interpreted in an idealized or overly formal manner unless otherwise defined in the embodiments of the present invention.

In the implementation of integrated circuits (ICs), electrostatic discharge (ESD) protection circuits are generally used to prevent static electricity from causing damage to the ICs. However, the ESD protection circuits contain parasitic capacitance, which reduce the bandwidth of the output/input port circuits of the ICs and affect the quality of the transmitting and receiving signals of the ICs. In the past, T-coil circuits were used to absorb the parasitic capacitance of the ESD protection circuits to expand the bandwidth of the output/input port circuit (I/O port) with the ESD protection circuits.

Figure 2:
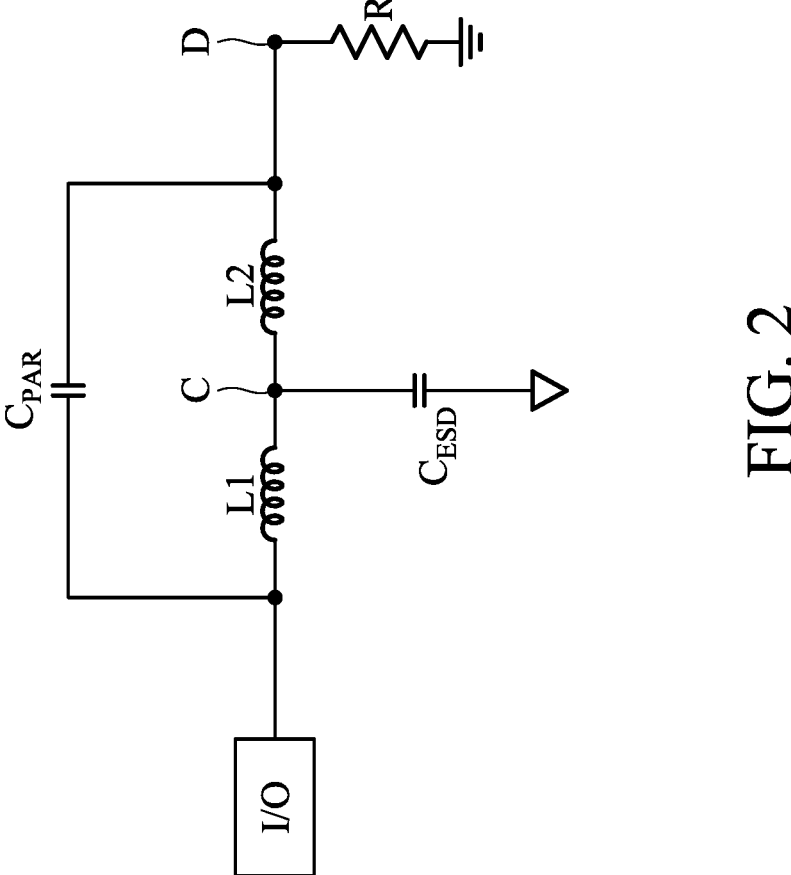
FIG. 2 is a schematic diagram of a T-coil 200 in the prior art.

FIG. 2 is a schematic diagram of a T-coil 200 in the prior art. As shown in FIG. 2, the T-coil 200 includes an input and output terminal I/O, an inductor L1, an inductor L2, a capacitor $C_{ESD}$, a capacitor $C_{PAR}$, and a terminal resistor R. The inductor L1 is electrically connected between the node C and the input and output terminal I/O. The inductor L2 is electrically connected between the node C and the node D. The capacitor $C_{ESD}$ is electrically connected between the node C and the ground. The capacitor $C_{PAR}$ is connected across the inductor L1 and the inductor L2. The terminal resistor R is electrically connected between the node D and the ground. The T-coil 200 is a conventional T-coil circuit.

In FIG. 2, the capacitor $C_{PAR}$ is the parasitic capacitor between the inductor L1 and the inductor L2. The capacitor $C_{ESD}$ is the parasitic capacitor generated when an electrostatic discharge diode is connected to the node C. The electrostatic discharge diode is used to protect against the electrostatic pulses from the input and output terminal I/O. In the application of the conventional T-coil circuit, the receiving circuit and the transmitting circuit are both electrically connected to the node C, such that the capacitor $C_{ESD}$ further includes the parasitic capacitance generated when the receiving circuit and the transmitting circuit are electrically connected to the node C. Although the T-coil 200 also has the function of expanding the bandwidth of the entire transmission line, for example, by 3 times the original, due to the influence of the parasitic capacitance generated when the transmitting circuit and the receiving circuit are connected to the T-coil circuit at the same time, the high-frequency response of the entire transmission line becomes worse, such that the basic bandwidth of the entire transmission line smaller and thus reduces the efficiency of the T-coil circuit in expanding the bandwidth.

Furthermore, in the conventional T-coil circuit 200 in FIG. 2, the point C is the contact point for receiving/transmitting signals, and the point D is used to terminate the characteristic impedance to achieve impedance matching. However, since there is an all-pass transfer function from the output/input port circuit to the point D, this all-pass transfer function contains zeros on the right half plane, which is not suitable for the application of serial data transmission (SerDes). Therefore, the electronic device 100 with the high-frequency impedance matching circuit 106 of the present invention is designed and will be described below.

FIG. 1 is a schematic diagram of an electronic device 100 according to an embodiment of the invention. As shown in FIG. 1, the electronic device 100 includes a shared pin 102p, a shared pin 102n, a bandwidth extension circuit 104, a high-frequency impedance matching circuit 106, a receiving circuit 108, a transmitting circuit 110, a switch 112p, a switch 112n, and a terminal resistor RT, and terminal resistor RT5. In some embodiments, the electronic device 100 receives or transmits a signal through the shared pin 102p and the shared pin 102n. In the embodiment of FIG. 1, the signal may be, for example, a differential signal. For example, the signal may include a positive-phase signal Sp and a negative-phase signal Sn. The shared pin 102p is used to receive or transmit the positive-phase signal Sp in the signal. The shared pin 102n is used to receive or transmit the negative-phase signal Sn in the signal.

However, the present invention does not limit the signal to be a differential signal. For example, if the signal is not a differential signal, the electronic device 100 only needs to receive or transmit the signal through one of the shared pin 102p and the shared pin 102n. In some embodiments, the electronic device 100 may be, for example, a semiconductor package. The shared pin 102p may be, for example, a pin of the semiconductor package. The shared pin 102n may be, for example, another pin of the semiconductor package. In some embodiments, the semiconductor packaging may utilize any existing packaging technology in the industry, such as wafer level chip scale package (WLCSP), chip on flex (COF), chip on glass (COG), and chip on plastic (COP).

In the embodiment of FIG. 1, the bandwidth extension circuit 104 is electrically coupled to the shared pin 102p and the shared pin 102n. Specifically, the bandwidth extension circuit 104 is electrically coupled to the shared pin 102p and the shared pin 102n through the high-frequency impedance matching circuit 106. In the embodiment of FIG. 1, the bandwidth extension circuit 104 includes an inductor LP1, an inductor LP2, a capacitor $C_{ESDP}$, a capacitor CP1, and a capacitor CP2. The high-frequency impedance matching circuit 106 includes an inductor LP, a capacitor CP3, a capacitor CP4, a resistor RT1, and a resistor RT2. In some embodiments, the inductor LP1 is electrically connected between the shared pin 102p (or the inductor LP) and a node A. The inductor LP2 is electrically connected to the inductor LP1 through the node A. The capacitor $C_{ESDP}$ is electrically connected between the node A and a ground. The capacitor CP1 is electrically connected between the shared pin 102p (or the inductor LP) and the ground. The capacitor CP2 is electrically connected between the inductor LP2 and the ground.

In some embodiments, the inductor LP1 is different from the inductor LP2, and there is no coupling effect between the inductor LP1 and the inductor LP2. In some embodiments, there is no mutual inductance between the inductor LP1 and the inductor LP2, or the mutual inductance between the inductor LP1 and the inductor LP2 is reduced as much as possible. In other words, the magnetic lines generated by the inductor LP1 do not intersect with the magnetic lines generated by the inductor LP2. In some embodiments, when viewed from above, the angle between the inductor LP1 and the inductor LP2 may be 90 degrees, but the invention is not limited thereto. In some embodiments, a semiconductor package includes a semiconductor chip. The semiconductor chip may include the bandwidth extension circuit 104, for example. The node A is a pin of the semiconductor chip. The inductor LP1 and the inductor LP2 are bonding wires for electrically connecting to the shared pin 102p.

In some embodiments, the capacitor $C_{ESDP}$ in the bandwidth extension circuit 104 includes parasitic capacitance generated when an electrostatic discharge (ESD) diode is connected to the node A. The ESD diode is used to protect against the electrostatic pulses from the shared pin 102p. The capacitor CP1 and the capacitor CP2 are the parasitic capacitors generated between layers in the semiconductor chip, and/or the parasitic capacitors generated by the adjacent wires in the circuit layout of the semiconductor chip.

In the embodiment of FIG. 1, the high-frequency impedance matching circuit 106 includes an inductor LP, a capacitor CP3, a capacitor CP4, a resistor RT1, and a resistor RT2. In some embodiments, the inductor LP is electrically connected between the shared pin 102p and the inductor LP1. The capacitor CP3 is electrically connected to one terminal of the inductor LP. The capacitor CP4 is electrically connected to another terminal of inductor LP. The resistor RT1 is electrically connected between the capacitor CP3 and the ground. The resistor RT2 is electrically connected between the capacitor CP4 and the ground. In some embodiments, the switch 112p is electrically connected to the inductor LP2 and the capacitor CP2. The terminal resistor RT is electrically connected between the switch 112p and the ground. When the electronic device 100 receives a signal through the shared pin 102p, the switch 112p is turned on. On the other hand, when the electronic device 100 transmits a signal through the shared pin 102p, the switch 112p is turned off.

When the signal is a differential signal, the bandwidth extension circuit 104 further includes an inductor LN1, an inductor LN2, a capacitor $C_{ESDN}$, a capacitor CN1, and a capacitor CN2. The high-frequency impedance matching circuit 106 further includes an inductor LN, a capacitor CN3, a capacitor CN4, a resistor RT3, and a resistor RT4. In some embodiments, the inductor LN1 is electrically connected between the shared pin 102n (or the inductor LN) and a node B. The inductor LN2 is electrically connected to the inductor LN1 through the node B. The capacitor $C_{ESDN}$ is electrically connected between the node B and the ground. The capacitor CN1 is electrically connected between the shared pin 102n (or the inductor LN) and the ground. The capacitor CN2 is electrically connected between the inductor LN2 and the ground.

In some embodiments, the inductor LN1 is different from the inductor LN2, and there is no coupling effect between the inductor LN1 and the inductor LN2. In some embodiments, there is no mutual inductance between the inductor LN1 and the inductor LN2, or the mutual inductance between the inductor LN1 and the inductor LN2 is reduced as much as possible. In other words, the magnetic lines generated by the inductor LN1 do not intersect with the magnetic lines generated by the inductor LN2. In some embodiments, when viewed from above, the angle between the inductor LN1 and the inductor LN2 may be 90 degrees, but the invention is not limited thereto. In some embodiments, the node B is a pin of the semiconductor chip. The inductor LN1 and the inductor LN2 are bonding wires for electrically connected to the shared pin 102n.

In some embodiments, the capacitor $C_{ESDN}$ in the bandwidth extension circuit 104 includes parasitic capacitance generated when the electrostatic discharge diode is connected to the node B. The electrostatic discharge diode is used to protect against the electrostatic pulses from the shared pin 102n. The capacitor CN1 and the capacitor CN2 are the parasitic capacitors generated between layers in the semiconductor chip, and/or the parasitic capacitors generated by the adjacent wires in the circuit layout of the semiconductor chip.

When the signal is a differential signal, the high-frequency impedance matching circuit 106 further includes an inductor LN, a capacitor CN3, a capacitor CN4, a resistor RT3, and a resistor RT4. In some embodiments, the inductor LN is electrically connected between the shared pin 102n and the inductor LN1. The capacitor CN3 is electrically connected to one terminal of the inductor LN. The capacitor CN4 is electrically connected to another terminal of the inductor LN. The resistor RT3 is electrically connected between the capacitor CN3 and the ground. The resistor RT4 is electrically connected between the capacitor CN4 and the ground. In some embodiments, the switch 112n is electrically connected to the inductor LN2 and the capacitor CN2. The terminal resistor RT5 is electrically connected between the switch 112n and the ground. When the electronic device 100 receives a signal through the shared pin 102n, the switch 112n is turned on. On the other hand, when the electronic device 100 transmits a signal through the shared pin 102n, the switch 112n is turned off.

When the signal is a differential signal, the signal may include a positive-phase signal Sp and a negative-phase signal Sn. The shared pin 102p is used to receive or transmit the positive-phase signal Sp in the signal. The shared pin 102n is used to receive or transmit the negative-phase signal Sn in the signal. In some embodiments, the receiving circuit (RX) 108 is electrically connected to the node A and the node B for receiving signals (for example, including the positive-phase signal Sp and the negative-phase signal Sn) from the shared pin 102p and the shared pin 102n. The transmitting circuit (TX) 110 is electrically connected to the inductor LP2 and the inductor LN2 for transmitting signals (for example, including the positive-phase signal Sp and the negative-phase signal Sn) to the shared pin 102p and the shared pin 102n.

In some embodiments, in addition to the parasitic capacitance generated when the electrostatic discharge diode is connected to the node A and the node B, the capacitor $C_{ESDP}$ and the capacitor $C_{ESDN}$ further include the parasitic capacitance generated when the receiving circuit 108 is electrically connected to the node A and the node B. In some embodiments, in addition to the parasitic capacitance generated between layers in the semiconductor chip and/or the parasitic capacitance generated by the adjacent wires in the circuit layout of the semiconductor chip, the capacitor CP2 and the capacitor CN2 further include the parasitic capacitance generated when the transmitting circuit 110 is connected to the inductor LP2 and the inductor LN2.

When the signal is a differential signal, the positive-phase signal Sp and the negative-phase signal Sn include a high-frequency component signal and a low-frequency component signal respectively. In the actual circuit application in FIG. 1, when the electronic device 100 receives the positive-phase signal Sp and the negative-phase signal Sn through the shared pin 102p and the shared pin 102n, since for the high-frequency component signal, the impedances of the capacitor CP3 and the capacitor CN3 are extremely small (equivalent to a short circuit), and the impedances of the inductor LP and the inductor LN are extremely large (equivalent to an open circuit), the high-frequency component signals in the positive-phase signal Sp and the negative-phase signal Sn will pass through the capacitor CP3 and the capacitor CN3 and terminate in the resistor RT1 and the resistor RT3. Therefore, the high-frequency impedance matching circuit 106 can effectively improve the frequency response of the electronic device 100 when transmitting the high-frequency component signals.

Similarly, when the electronic device 100 receives the positive-phase signal Sp and the negative-phase signal Sn through the shared pin 102p and the shared pin 102n respectively, since for the low-frequency component signal, the impedance of the capacitor CP3, the capacitor CN3, the capacitor CP4, the capacitor CN4, the capacitor CP1, the capacitor CN1, the capacitor $C_{ESDP}$, the capacitor $C_{ESDN}$, the capacitor CP2, and the capacitor CN2 is extremely large (equivalent to an open circuit), and the impedance of the inductor LP, inductor LN, inductor LP1, inductor LN1, inductor LP2, and inductor LN2 is extremely small (equivalent to a short circuit), the low-frequency component signals in the positive-phase signal Sp and the negative-phase signal Sn will first pass through the inductor LP, the inductor LN, the inductor LP1, the inductor LN1, the inductor LP2, and the inductor LN2, then pass through the switch 112p and the switch 112n (the switch 112p and the switch 112n are in the on state), and terminate in the terminal resistor RT and the terminal resistor RT5. Therefore, the frequency response of the electronic device 100 when transmitting low-frequency component signals is still very good.

The high-frequency impedance matching circuit 106 of the electronic device 100 of the present invention can effectively improve the high-frequency response of the entire transmission line, which makes the basic bandwidth of the entire transmission line larger. In addition, only the receiving circuit 108 is connected in series to the nodes A and the nodes B in the bandwidth extension circuit 104, the transmitting circuit 110 is connected in series to the back end of the bandwidth extension circuit 104, the superposition of the parasitic capacitance is reduced, and finally the bandwidth extension circuit 104 is used to double the basic bandwidth of the entire transmission line, so that the electronic device 100 has a good frequency response whether it is high frequency or low frequency. That is, the signal received by the electronic device 100 can be almost transmitted completely and only few part is reflected.

On the other hand, in order to ensure that there is no coupling effect or mutual inductance between the inductor LP1 and the inductor LP2, and between the inductor LN1 and the inductor LN2, or to reduce the mutual inductance between the two as much as possible, the distance between the inductor LP1 and the inductor LP2 and the distance between the inductor LN1 and the inductor LN2 are bound to increase. Even so, the electronic device 100 of the present invention can still effectively increase the transmission efficiency and quality of the signal transmitted between the semiconductor package and its internal semiconductor chip, reduce the delay caused by the different frequency components included in the signal during the signal transmission, and improve the eye pattern during the signal transmission. The electronic device 100 of the present invention is suitable for the applications related to the high-speed and wide-band serial data transmission, such as high-speed peripheral component interconnect express (PCI-E), universal serial bus (USB), and serial advanced technology attachment (SATA), but not limited to thereto.

Although the embodiments of the present invention are described above, it should be understood that what is presented above is only an example and not a limitation. According to the above-described exemplary embodiments, many changes to the embodiments can be implemented without violating the spirit and scope of the disclosure. Therefore, the breadth and scope of the present invention should not be limited by the above-described embodiments. Specifically, the scope of the present invention should be defined by the following claims and their equivalents. Although the above disclosure has been illustrated and described in one or more related implementations, equivalent changes and modifications will be figured out according to the above descriptions and illustrations by others familiar with the art. Furthermore, although a particular feature of the invention has been illustrated by one of the associated implementations, the above feature may be combined with one or more other features as may be required and useful for any known or particular application.

The technical terms used in this specification are only for the purpose of describing specific embodiments and are not intended to be used as limitations of the present invention. Unless the context clearly indicates otherwise, the singular form used herein, such as "a" and "this" should also include the plural form. Furthermore, the words "include", "comprise", "have" or their variations are used either as detailed descriptions or as the claims. The above words mean to include, and to some extent are equivalent to the word "comprise". Unless otherwise defined, all terms used herein (including technical or scientific terms) can be generally understood by a person with ordinary skill in the art disclosed above. We should be more aware that the above terms, as defined in commonly used dictionaries, should be interpreted to have the same meaning in the context of the relevant technology. Unless specifically defined herein, the above terms are not interpreted as having idealistic or overly formal meanings.

What is claimed is:
1. An electronic device, comprising:
   a shared pin, wherein the electronic device receives or transmits a signal through the shared pin;

a bandwidth extension circuit, electrically coupled to the shared pin, and comprising:

a first inductor, electrically connected between the shared pin and a node;

a second inductor, electrically connected to the first inductor through the node;

a first capacitor, electrically connected between the node and a ground;

a second capacitor, electrically connected between the shared pin and the ground; and a third capacitor, electrically connected between the second inductor and the ground; and a high-frequency impedance matching circuit, electrically connected between the shared pin and the bandwidth extension circuit, and comprising:

a third inductor, electrically connected between the shared pin and the first inductor;

a fourth capacitor, electrically connected to one terminal of the third inductor;

a fifth capacitor, electrically connected to another terminal of the third inductor;

a first resistor, electrically connected between the fourth capacitor and the ground; and a second resistor, electrically connected between the fifth capacitor and the ground, wherein the first inductor and the second inductor are connected on each side of the node, and there is no coupling effect between the first inductor and the second inductor.

2. The electronic device as claimed in claim 1, further comprising:

a switch, electrically connected to the second inductor;

a terminal resistor, electrically connected between the switch and the ground;

wherein the switch is turned on when the electronic device receives the signal through the shared pin;

the switch is turned off when the electronic device transmits the signal through the shared pin.

3. The electronic device as claimed in claim 2, wherein the signal comprises a high-frequency component signal and a low-frequency component signal;

wherein when the electronic device receives the signal through the shared pin, the high-frequency component signal terminates in the first resistor and the low-frequency component signal terminates in the terminal resistor.

4. The electronic device as claimed in claim 1, wherein the signal is a differential signal.

5. The electronic device as claimed in claim 1, further comprising:

a receiving circuit, electrically connected to the node to receive the signal from the shared pin.

6. The electronic device as claimed in claim 5, wherein the first capacitor comprises parasitic capacitance generated when the receiving circuit is connected to the node.

7. The electronic device as claimed in claim 1, further comprising:

a transmitting circuit, electrically connected to the second inductor to transmit the signal to the shared pin.

8. The electronic device as claimed in claim 7, wherein the third capacitor comprises parasitic capacitance generated when the transmitting circuit is connected to the second inductor.

9. The electronic device as claimed in claim 1, wherein the first capacitor comprises parasitic capacitance generated when an electrostatic discharge diode is connected to the node.

10. The electronic device as claimed in claim 1, wherein the shared pin is a pin of a semiconductor package;

wherein the semiconductor package comprises a semiconductor chip.

11. The electronic device as claimed in claim 10, wherein the node is a pin of the semiconductor chip;

wherein the first inductor and the second inductor are bonding wires.

* * * * *